(12) United States Patent
Ma (10) Patent No.: US 10,833,289 B2
(45) Date of Patent: Nov. 10, 2020

(54) DISPLAY DEVICE AND METHOD OF MANUFACTURING THE SAME

(71) Applicant: Samsung Display Co., Ltd., Yongin-Si, Gyeonggi-Do (KR)

(72) Inventor: Jangseok Ma, Hwaseong-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 16/567,900

(22) Filed: Sep. 11, 2019

(65) Prior Publication Data

US 2020/0006699 A1 Jan. 2, 2020

Related U.S. Application Data

(62) Division of application No. 15/460,034, filed on Mar. 15, 2017, now abandoned.

(30) Foreign Application Priority Data

Mar. 22, 2016 (KR) ........................ 10-2016-0034154

(51) Int. Cl.
*H01L 51/52* (2006.01)
*H01L 51/00* (2006.01)
*H01L 51/56* (2006.01)
*B32B 27/06* (2006.01)
*B32B 7/12* (2006.01)
*B32B 37/14* (2006.01)
*B32B 37/12* (2006.01)
*B32B 3/02* (2006.01)
*B32B 17/00* (2006.01)
(Continued)

(52) U.S. Cl.
CPC ............ *H01L 51/5246* (2013.01); *B32B 3/02* (2013.01); *B32B 3/08* (2013.01); *B32B 7/12* (2013.01); *B32B 17/00* (2013.01); *B32B 27/06* (2013.01); *B32B 37/12* (2013.01); *B32B 37/14* (2013.01); *B32B 38/0008* (2013.01); *H01L 51/0096* (2013.01); *H01L 51/5271* (2013.01); *H01L 51/5281* (2013.01); *H01L 51/5284* (2013.01); *H01L 51/56* (2013.01); (Continued)

(58) Field of Classification Search
None
See application file for complete search history.

(56) References Cited

U.S. PATENT DOCUMENTS

2009/0207350 A1 8/2009 Iida
2010/0196827 A1* 8/2010 Leenders ................ B41C 1/003
430/306

(Continued)

FOREIGN PATENT DOCUMENTS

JP 2007-248244 A 9/2007
KR 10-2003-0004656 A 1/2003
(Continued)

OTHER PUBLICATIONS

Lise-Marie Lacroix, "New generation of magnetic and luminescent nanoparticles for in vivo real-time imaging, Interface Focus", Jan. 3, 2012, 1-19, vol. 3, Royal Society Publishing.

*Primary Examiner* — Edward J Glick
*Assistant Examiner* — Anthony G Quash
(74) *Attorney, Agent, or Firm* — Innovation Counsel LLP (57) ABSTRACT

Provided is a display device including a display panel having a display region and a non-display region, a window covering the display panel, and an adhesive member interposed between the display panel and the window to adhere the window to the display panel. The composition material of the adhesive member includes an adhesive layer which is cured by light and a wavelength conversion material which converts the light into infrared rays.

4 Claims, 6 Drawing Sheets

(51) Int. Cl.
  *B32B 3/08* (2006.01)
  *B32B 38/00* (2006.01)
(52) U.S. Cl.
  CPC ... *B32B 2037/1253* (2013.01); *B32B 2255/10* (2013.01); *B32B 2255/20* (2013.01); *B32B 2255/205* (2013.01); *B32B 2307/40* (2013.01); *B32B 2307/4026* (2013.01); *B32B 2307/416* (2013.01); *B32B 2307/42* (2013.01); *B32B 2307/7265* (2013.01); *B32B 2310/0831* (2013.01); *B32B 2457/20* (2013.01); *B32B 2457/202* (2013.01); *B32B 2457/206* (2013.01); *H01L 51/5237* (2013.01); *H01L 2251/5369* (2013.01)

(56) References Cited

U.S. PATENT DOCUMENTS

| | | | | |
|---|---|---|---|---|
| 2011/0242467 | A1* | 10/2011 | Kim | G02F 1/133308 349/113 |
| 2013/0064967 | A1* | 3/2013 | Feinstein | B05C 9/12 427/8 |
| 2015/0041042 | A1 | 2/2015 | Zhang et al. | |
| 2015/0075698 | A1* | 3/2015 | Lu | C09J 5/06 156/60 |
| 2015/0212370 | A1* | 7/2015 | Harayama | G02F 1/133512 349/42 |
| 2015/0228870 | A1 | 8/2015 | Goeoetz et al. | |
| 2016/0033823 | A1* | 2/2016 | Lee | G02F 1/133617 349/71 |
| 2016/0161770 | A1 | 6/2016 | Joo et al. | |
| 2016/0170127 | A1 | 6/2016 | Kim et al. | |
| 2018/0017817 | A1* | 1/2018 | Ren | G02F 1/1339 |

FOREIGN PATENT DOCUMENTS

| | | |
|---|---|---|
| KR | 10-2007-0089834 A | 9/2007 |
| KR | 10-2007-0093827 A | 9/2007 |
| KR | 10-2011-0100888 A | 9/2011 |
| KR | 10-2011-0111749 A | 10/2011 |
| KR | 10-2014-0063159 A | 5/2014 |

* cited by examiner

DISPLAY DEVICE AND METHOD OF MANUFACTURING THE SAME

CROSS-REFERENCE TO RELATED APPLICATION

This application is a divisional application of U.S. patent application Ser. No. 15/460,034 filed on Mar. 15, 2017, which claims priority under 35 U.S.C. § 119 of Korean Patent Application No. 10-2016-0034154, filed on Mar. 22, 2016, the entire contents of which are hereby incorporated by reference.

BACKGROUND

The present disclosure herein relates to a display device, and more particularly, to a display device including a window and a method for manufacturing the same.

A display device is a device for displaying an image, and the display device displays an image through an information processing device. A portable display device such as a mobile phone and a tablet PC may include a display panel and a window covering the display panel.

Generally, the composition material of the window may include glass or plastic, and the window has a non-optical property and covers the display region of the display panel. Therefore, the window protects the display panel from external impacts and protects the display panel from factors such as moisture or water which may cause malfunction of the display panel.

SUMMARY

The present disclosure provides a display device having a structure in which an assembly process between a display panel and a window may be made easier, and a method of manufacturing the same.

An embodiment of the inventive concept provides a display device including a display panel having a display region and a non-display region, a window covering the display panel, and an adhesive member interposed between the display panel and the window to adhere the window to the display panel.

The composition material of the adhesive member may include an adhesive layer which is cured by light, and a wavelength conversion material which is configured to convert the light into infrared rays.

In an embodiment, the display device may further include a light blocking layer disposed on the window. The light blocking layer may include a first light blocking part which is disposed on one surface of the window and overlaps the non-display region, and a second light blocking part disposed on a side surface of the window.

In an embodiment, the display device may further include a polarizing plate which is adhered to the display panel and is in contact with the adhesive member, a first reflective layer disposed on the light blocking layer and positioned between the light blocking layer and the adhesive member, and a second reflective layer disposed on the polarizing plate and positioned between the polarizing plate and the adhesive member.

In an embodiment, the wavelength conversion material may include a quantum dot.

In an embodiment, the wavelength conversion material may include a dye.

In an embodiment of the inventive concept, a display device includes a display panel having a display region and a non-display region, a window covering the display panel, an adhesive member interposed between the display panel and the window to adhere the window to the display panel, and a first light emitting layer which is disposed on the window and overlaps the non-display region.

The adhesive member may include an adhesive layer which is cured by light, and the composition material of the first light emitting layer may include a first wavelength conversion material which is configured to convert the light into infrared rays.

In an embodiment, the display device may further include a polarizing plate adhered to the display panel and positioned between the display panel and the adhesive member, and a second light emitting layer disposed on the polarizing plate and positioned between the polarizing plate and the adhesive member. In addition, the composition material of the second light emitting layer may include a second wavelength conversion material which is configured to convert the light into infrared rays.

In an embodiment, the display device may further include a light blocking layer disposed on the window. The light blocking layer may include a first light blocking part which is disposed on one surface of the window and overlaps the non-display region, and a second light blocking part disposed on a side surface of the window.

In an embodiment, the display device may further include a first reflective layer disposed between the light blocking layer and the first light emitting layer, and a second reflective layer disposed between the polarizing plate and the second light emitting layer.

In an embodiment of the inventive concept, a method for manufacturing a display device includes the following steps: providing an adhesive layer between a display panel and a window, the adhesive member being formed of an adhesive layer and a wavelength conversion material dispersed inside the adhesive layer, irradiating the adhesive member with light to cure the adhesive layer, measuring infrared rays emitted from the adhesive member corresponding to the light, and adjusting the intensity or the irradiation amount of the light irradiated to the adhesive member on the basis of the measured intensity and the emission amount of the infrared rays.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Hereinafter, embodiments of the present disclosure will be described in detail with reference to the accompanying drawings. The objects, features and effects of the present disclosure described above may be easily understood through the embodiments related to the drawings. However, the present disclosure is not limited to the embodiments described herein, but may be modified in various forms. Rather, the embodiments of the present disclosure described below are provided to further clarify the technical idea posted by the present disclosure, further, to sufficiently transmit the technical idea of the present disclosure to those skilled in the art to which the present disclosure belongs. Accordingly, the scope of the present disclosure should not be construed as being limited by the embodiments described below. In the following embodiments and the drawings, the same reference numerals denote the same elements.

Figure 1:
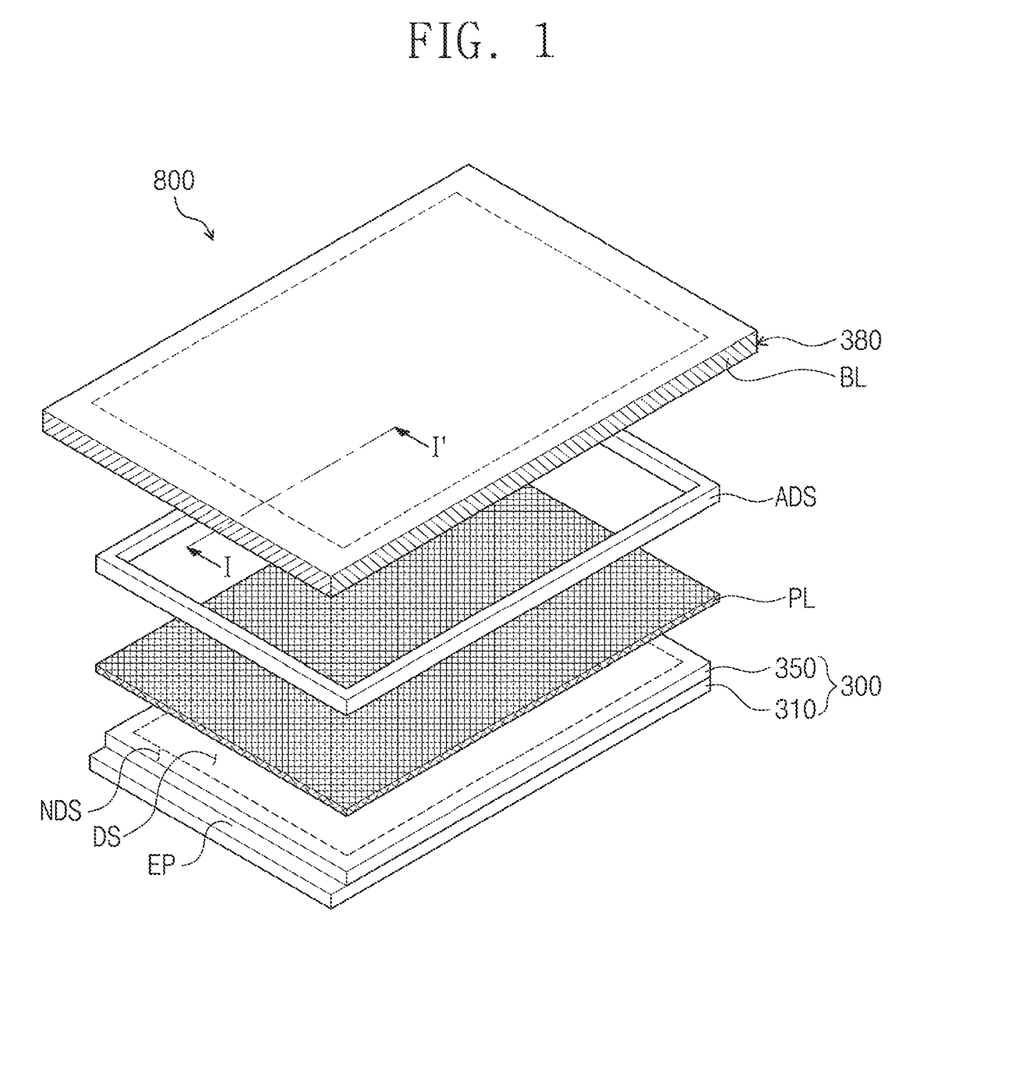
FIG. 1 is an exploded perspective view of a display device according to an embodiment of the present disclosure.
Figure 2:
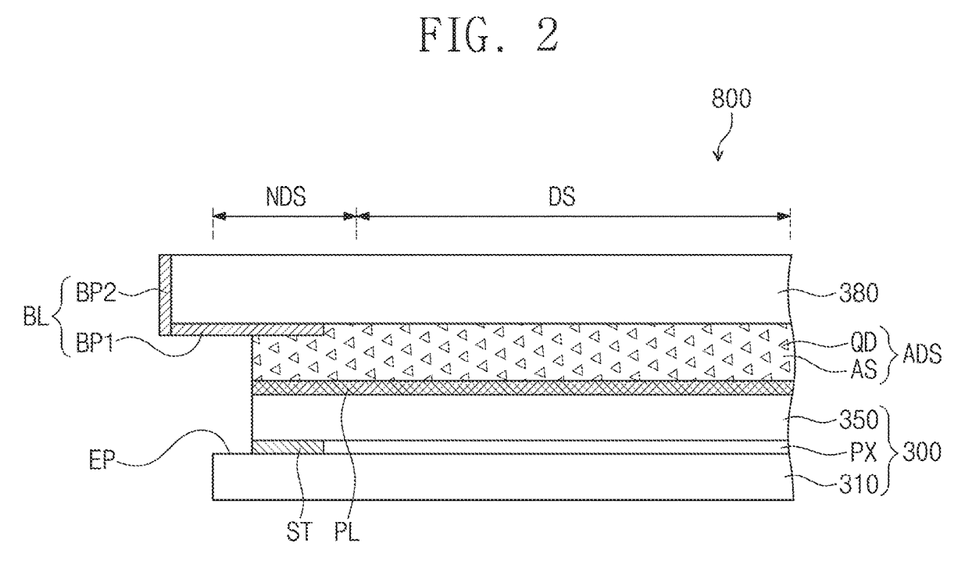
FIG. 2 is a cross-sectional view of a cross section taken along line I-I' illustrated in FIG. 1.

FIG. 1 is an exploded perspective view of a display device according to an embodiment of the present disclosure, and FIG. 2 is a cross-sectional view of a cross section taken along line I-I' illustrated in FIG. 1.

Referring to FIG. 1 and FIG. 2, a display device 800 is a device for displaying an image, and in this embodiment, the display device 800 may be an organic light emitting display device. However, the present disclosure is not limited to the kind of the display device 800. For example, in another embodiment, the display device 800 may be a liquid crystal display device.

The display device 800 includes a display panel 300, a polarizing plate PL, a window 380, a light blocking layer BL, and an adhesive member ADS.

The display panel 300 has a display region DS and a non-display region NDS surrounding the display region DS, and the display panel 300 displays an image through the display region DS. In this embodiment, the display panel 300 may be an organic light emitting display panel, and the display panel 300 includes a display substrate 310, an encapsulation substrate 350, a pixel layer PX, and a coupling member ST.

The display substrate 310 may be a glass substrate or a plastic substrate, and the pixel layer PX is disposed on the display substrate 310. A terminal portion EP is defined on one side of the display substrate 310, and a driving chip (not illustrated) may be mounted on the terminal portion EP.

In this embodiment, the pixel layer PX may include a plurality of pixels. Each of the plurality of pixels may include an anode, a cathode, and an organic light emitting layer disposed between the anode and the cathode.

The encapsulation substrate 350 faces the display substrate 310, and is coupled to the display substrate 310 by the coupling member ST. The encapsulation substrate 350 seals the pixel layer PX to protect the pixel layer from external water.

In this embodiment, the display panel 300 may have the structure described above; however, the present disclosure is not limited to the structure of the display panel 300. For example, in another embodiment, the encapsulation substrate 350 may be replaced by thin encapsulation layers, and the thin encapsulation layers may have a structure in which an organic layer and an inorganic layer are alternately repeatedly laminated. In addition, in another embodiment, the coupling member ST may be omitted.

The polarizing plate PL polarizes light outputted from the display panel 300. The polarizing plate PL is adhered to the display panel 300, and more specifically, the polarizing plate PL is attached to the encapsulation substrate 350 and is in contact with the adhesive member ADS.

In this embodiment, the polarizing substrate PL may circularly polarize light emitted from the display panel 300. In another embodiment, the display device 800 may further include a retardation plate attached to the display panel 300 to change a phase difference of light emitted from the display panel 300.

The window 380 covers the display panel 300 to protect the display panel 300 from external impact. In this embodiment, the window 380 may be a glass substrate or a plastic substrate having light transmittance.

The light blocking layer BL is disposed on the back surface of the window 380 and overlaps the non-display region NDS. The light blocking layer BL may include a light absorbing material such as carbon black. Therefore, one region of the window 380 corresponding to the non-display region NDS may be defined as a non-transmissive region by the light blocking layer BL.

In this embodiment, the light blocking layer BL may be further disposed on a side surface of the window 380 as well as on the back surface. Accordingly, the light blocking layer BL includes a first light blocking part BP1, and a second light blocking part BP2, wherein the first light blocking part BP1 is disposed on the back surface of the window 380 and overlaps the non-display region NDS, and the second light blocking part BP2 is disposed on the side surface of the window 380. When the process, to be described later, of irradiating the adhesive member ADS with light to cure the adhesive member ADS, and of adhering the window 380 to the display panel 300 using the adhesive member ADS is performed, the second light blocking part BP2 prevents the light from entering the inside of the window 380 through the side surface of the window 380.

In this embodiment, the first light blocking part BP1 and the second light blocking part BP2 may have an integrated shape. Therefore, the light blocking layer BL may have a shape extending from the back surface of the window 380 which overlaps the non-display region, to the side surface of the window 380.

In another embodiment, the second light blocking part BP2 may be separated from the first light blocking part BP1, and the second light blocking part BP2 may have a shape of dots arranged at intervals along the side surface of the window 380.

The adhesive member ADS is interposed between the display panel 300 and the window 380 to adhere the window 380 to the display panel 300. As used herein, the word "adhere" may mean to attach one element in direct contact with another element, and may also mean to attach one element which is not in direct contact with another element, i.e. indirectly. In this embodiment, the adhesive member ADS may have an elongated shape along the four corners of the display panel 300 having a rectangular shape. In another embodiment, the adhesive member ADS may be provided on the entire surface of the display panel 300.

In this embodiment, the composition material of the adhesive member ADS may include an adhesive layer AS and a wavelength conversion material QD dispersed inside of the adhesive layer AS.

In this embodiment, the adhesive layer AS may have a light curing property and a light transmitting property. For example, the adhesive layer AS may have a non-optical property such as optically clear resin (OCR) and a property of being cured by light.

The wavelength conversion material QD converts provided light into infrared rays. More specifically, the wavelength conversion material QD is provided with the adhesive member ADS which the light is irradiated with for the purpose of curing the adhesive layer AS, and converts the provided light into infrared rays.

In this embodiment, the adhesive layer AS may be cured by ultraviolet rays. In this case, the wavelength conversion material QD may include a quantum dot which converts the ultraviolet rays into infrared rays.

In this embodiment, the quantum dot may include at least one of InCuSe, InCuS2/ZnS, InAs/InP/ZnSe, PbS, InAs, PbSe/Te, CdS, ZnSe, or ZnS, and the wavelength conversion material QD may convert the ultraviolet rays into infrared rays having a wavelength of about 750 nanometers to about 1500 nanometers.

In another embodiment, the wavelength conversion material QD may include an infrared fluorescent dye which absorbs provided light and then emits ultraviolet rays.

Figure 3:
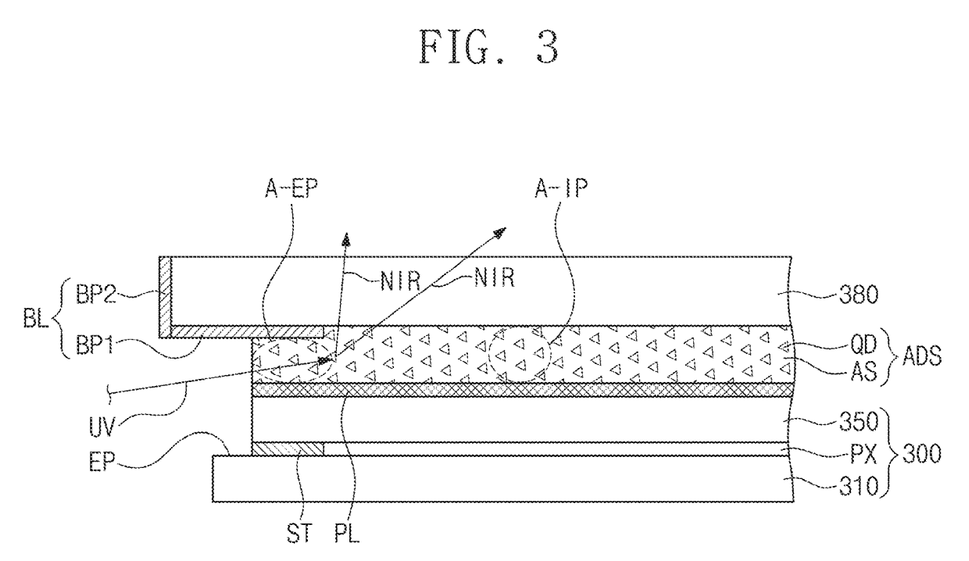
FIG. 3 is a view showing a function of a wavelength conversion material of the adhesive member illustrated in FIG. 2.

FIG. 3 is a view showing a function of a wavelength conversion material QD of an adhesive member illustrated in FIG. 2.

Referring to FIG. 3, when the adhesive member ADS is irradiated with ultraviolet rays UV to cure the adhesive member ADS, and the window 380 is adhered to the display panel 300 by the adhesive member ADS, the wavelength conversion material QD converts the ultraviolet rays UV into infrared rays NIR.

Therefore, when the adhesive material ADS is cured to adhere the window 380 to the display panel 300, the infrared rays NIR are emitted from the wavelength conversion material QD, and the intensity of the emitted infrared rays NIR or the measured value of the emitted amount per unit time may be used for estimating the irradiation amount of the ultraviolet rays UV the adhesive member ADS side is irradiated with. Further, the measured value may be used for estimating the cured degree of the adhesive member ADS.

More specifically, the first light blocking part BP1 of the light blocking layer BL may absorb the ultraviolet rays UV to be irradiated with, and accordingly, an edge portion A-EP of the adhesive member ADS which overlaps the first light blocking part BP1 may have a smaller irradiation amount of the ultraviolet rays UV than, for example, an inside portion A-IP of the adhesive member ADS. In this case, even if the edge portion A-EP and the inside portion A-IP of the adhesive member ADS are irradiated with ultraviolet rays UV for the same amount of time, the cured degree of the edge portion A-EP of the adhesive member ADS may be less than the cured degree of the inside portion A-IP of the adhesive member ADS.

Therefore, during the process of adhering the window 380 to the display panel 300 using the adhesive member ADS, the intensity or the value of the light amount of the infrared rays NIR emitted from the wavelength conversion material QD is measured, and when the measured value is smaller than a preset value, the irradiation amount of the ultraviolet rays UV the edge portion A-EP is irradiated with may be regarded as being smaller than the preset irradiation amount. In this case, the light amount or the intensity of the ultraviolet rays UV the adhesive member ADS is irradiated with may be increased, and thus, even if the time for irradiating the adhesive member ADS with the ultraviolet rays UV is not infinitely increased during the adhering process, the irradiation amount of the ultraviolet rays UV and the cured degree of the adhesive member ADS may be estimated in real time using the measured value.

Figure 4:
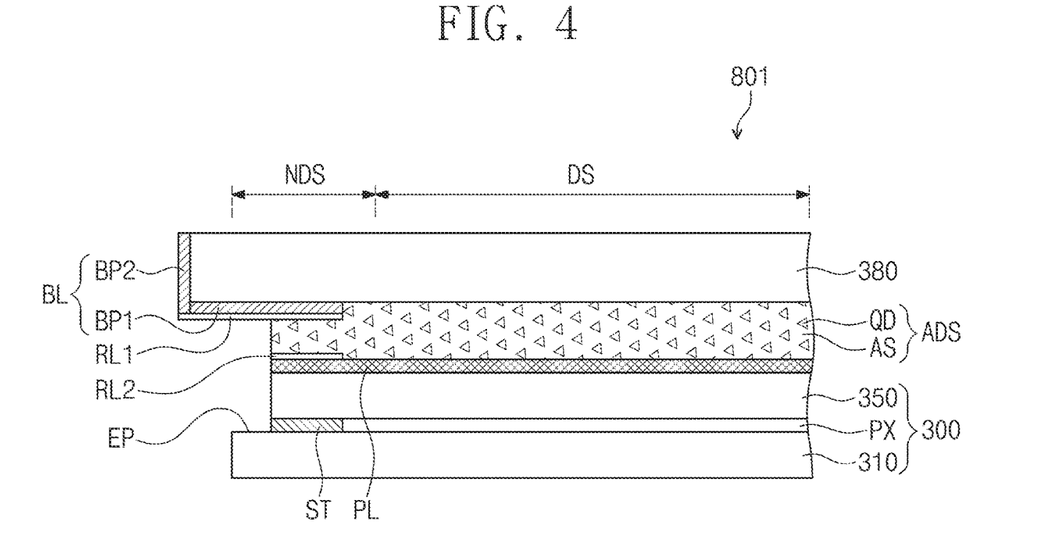
FIG. 4 is a cross-sectional view of a display device according to another embodiment of the present disclosure.

FIG. 4 is a cross-sectional view of a display device 801 according to another embodiment of the present disclosure. In the description of FIG. 4, the components described above are denoted by the same reference numerals, and redundant description of the components is omitted.

Referring to FIG. 4, the display device 801 includes a display panel 300, a polarizing plate PL, a window 380, a light blocking layer BL, an adhesive member ADS, a first reflective layer RL1, and a second reflective layer RL2. That is, when the structure of the display device 801 illustrated in FIG. 4 is compared with the structure of the display device 800 of FIG. 2 illustrated in FIG. 2, the display device 801 further includes the first reflective layer RL1 and the second reflective layer RL2.

The first reflective layer RL1 is disposed on a first light blocking part BP1 of the light blocking layer BL and positioned between the first light blocking part BP1 and the adhesive member ADS. Also, the second reflective layer RL2 is disposed on the polarizing plate PL and positioned between the polarizing plate PL and the adhesive member ADS. Each of the first reflective layer RL1 and the second reflective layer RL2 may be in contact with the adhesive member ADS.

In this embodiment, each of the first and the second reflective layers RL1 and RL2 may be a reflective tape having light reflectivity. For example, the reflective tape may be an adhesive tape coated with aluminum (Al) or silver (Ag). In another embodiment, the first reflective layer RL1 may have a shape coated with a reflective material on the first light blocking part BP1, and the second reflective layer RL2 may have a shape coated with a reflective material on the polarizing plate PL.

As described above, in the case that the display device 801 further includes the first reflective layer RL1 and the second reflective layer RL2, when the ultraviolet rays UV described with reference to FIG. 3 irradiate the adhesive member ADS, the amount of ultraviolet rays UV absorbed by the polarizing plate PL and the light blocking layer BL may be reduced. Therefore, even if the intensity of the irradiating ultraviolet rays is not increased, the time for curing the adhesive member ADS using the ultraviolet rays UV may be shortened.

Figure 5:
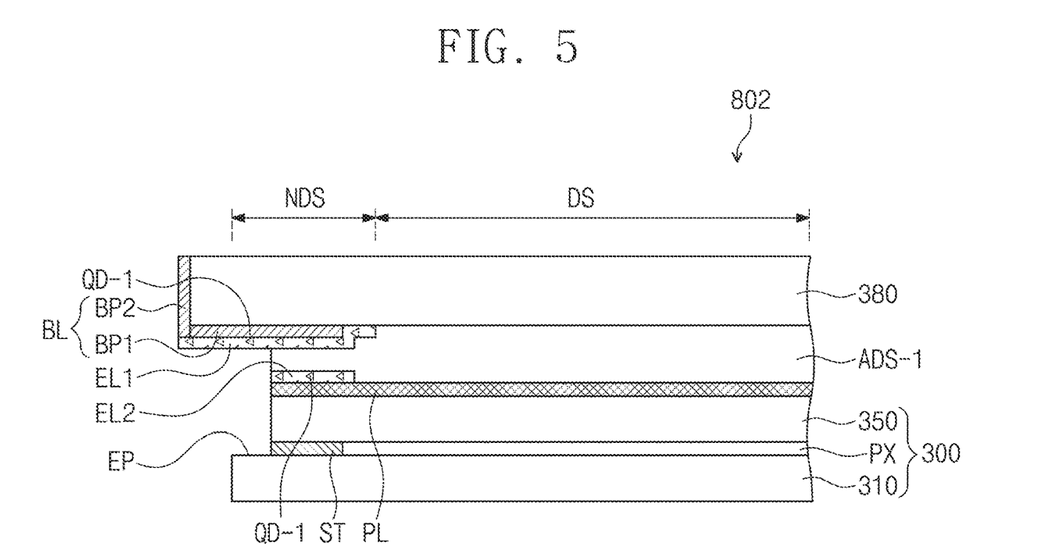
FIG. 5 is a cross-sectional view of a display device according to another embodiment of the present disclosure.

FIG. 5 is a cross-sectional view of a display device 802 according to another embodiment of the present disclosure. In the description of FIG. 5, the components described above are denoted by the same reference numerals, and redundant description of the components is omitted.

Referring to FIG. 5, the display device 802 includes a display panel 300, a polarizing plate PL, a window 380, a light blocking layer BL, an adhesive member ADS-1, a first light emitting layer EL1, and a second light emitting layer EL2.

The display device 800 of FIG. 2 described above with reference to FIG. 2 includes the adhesive member ADS of FIG. 2 having the wavelength conversion material QD of FIG. 2. However, in the embodiment illustrated in FIG. 5, the adhesive member ADS-1 includes a photo-curable adhesive layer, and the adhesive member ADS-1 does not include the wavelength converting material.

The first light emitting layer EL1 is disposed on the window 380 and overlaps a non-display region NDS, and the first light emitting layer EL1 is disposed on the first light blocking part BP1 of the light blocking layer BL and is in contact with the adhesive member ADS-1. Also, the second light emitting layer EL2 is disposed on the polarizing plate PL and overlaps the non-display region NDS, and the second light emitting layer EL2 is disposed between the polarizing plate PL and the adhesive member ADS-1 and is in contact with the adhesive member ADS-1.

Each of the first and the second light emitting layers EL1 and EL2 includes a wavelength conversion material QD-1. In this embodiment, the first light-emitting layer EL1 and the second light-emitting layer EL2 may include the same wavelength conversion material QD-1.

Like the wavelength conversion material QD of FIG. 2 illustrated in FIG. 2, the wavelength conversion material QD-1 converts provided light into infrared rays. More specifically, the wavelength conversion material QD-1 converts light, which is provided to the adhesive member ADS-1 for the purpose of curing the adhesive member ADS-1, into infrared rays.

In this embodiment, the adhesive member ADS-1 may include a resin which is cured by ultraviolet rays, and in this case, the wavelength conversion material QD-1 may include a quantum dot which converts the ultraviolet rays into infrared rays.

In another embodiment, the wavelength conversion material QD-1 may include an infrared fluorescent dye which absorbs provided light and then emits infrared rays.

As with the previously described embodiments, when the window 380 and the display panel 300 are adhered to each other using the adhesive member ADS-1, the intensity of the infrared rays emitted from the first and the second light emitting layers EL1 and EL2, or the emission amount per unit time of the infrared rays may be used for estimating the cured degree of the adhesive member ADS-1.

Figure 6:
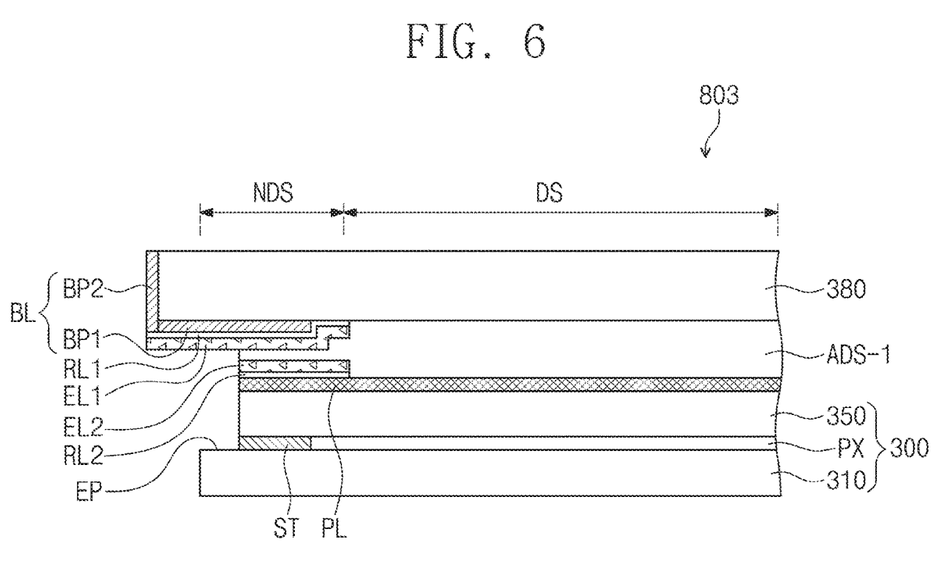
FIG. 6 is a cross-sectional view of a display device according to another embodiment of the present disclosure.

FIG. 6 is a cross-sectional view of a display device 803 according to another embodiment of the present disclosure. In the description of FIG. 6, the components described above are denoted by the same reference numerals, and redundant description of the components is omitted.

Referring to FIG. 6, the display device 803 includes a display panel 300, a polarizing plate PL, a window 380, a light blocking layer BL, an adhesive member ADS-1, a first reflective layer RL1, a second reflective layer RL2, a first light emitting layer EL1, and a second light emitting layer EL2. That is, when the structure of the display device 803 illustrated in FIG. 6 is compared with the structure of the display device 802 of FIG. 2 illustrated in FIG. 5, the display device 803 further includes the first reflective layer RL1 and the second reflective layer RL2.

The first reflective layer RL1 is disposed on a first light blocking part BP1 of the light blocking layer BL and positioned between the first light blocking part BP1 and the first light emitting layer EL1. Also, the second reflective layer RL2 is disposed on the polarizing plate PL and positioned between the polarizing plate PL and the second light emitting layer EL2.

In this embodiment, each of the first and the second reflective layers RL1 and RL2 has light reflectivity. Therefore, when the adhesive member ADS-1 is cured by irradiating the adhesive member ADS-1 with ultraviolet rays UV described with reference to FIG. 3, the amount of ultraviolet rays absorbed by the polarizing plate PL and the light blocking layer BL may be reduced.

Figure 7A:
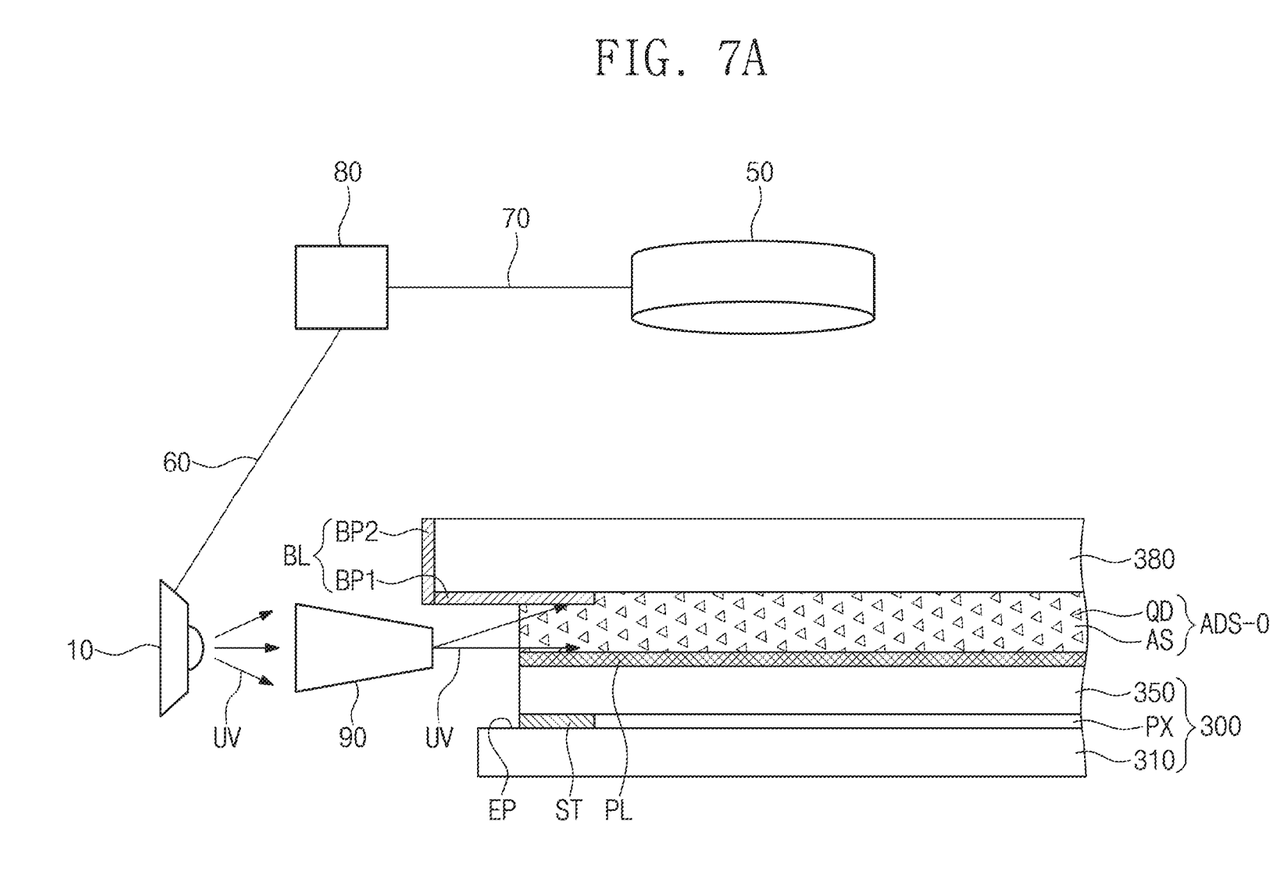
FIG. 7A and FIG. 7B are views showing methods of manufacturing the display device illustrated in FIG. 2.
Figure 7B:
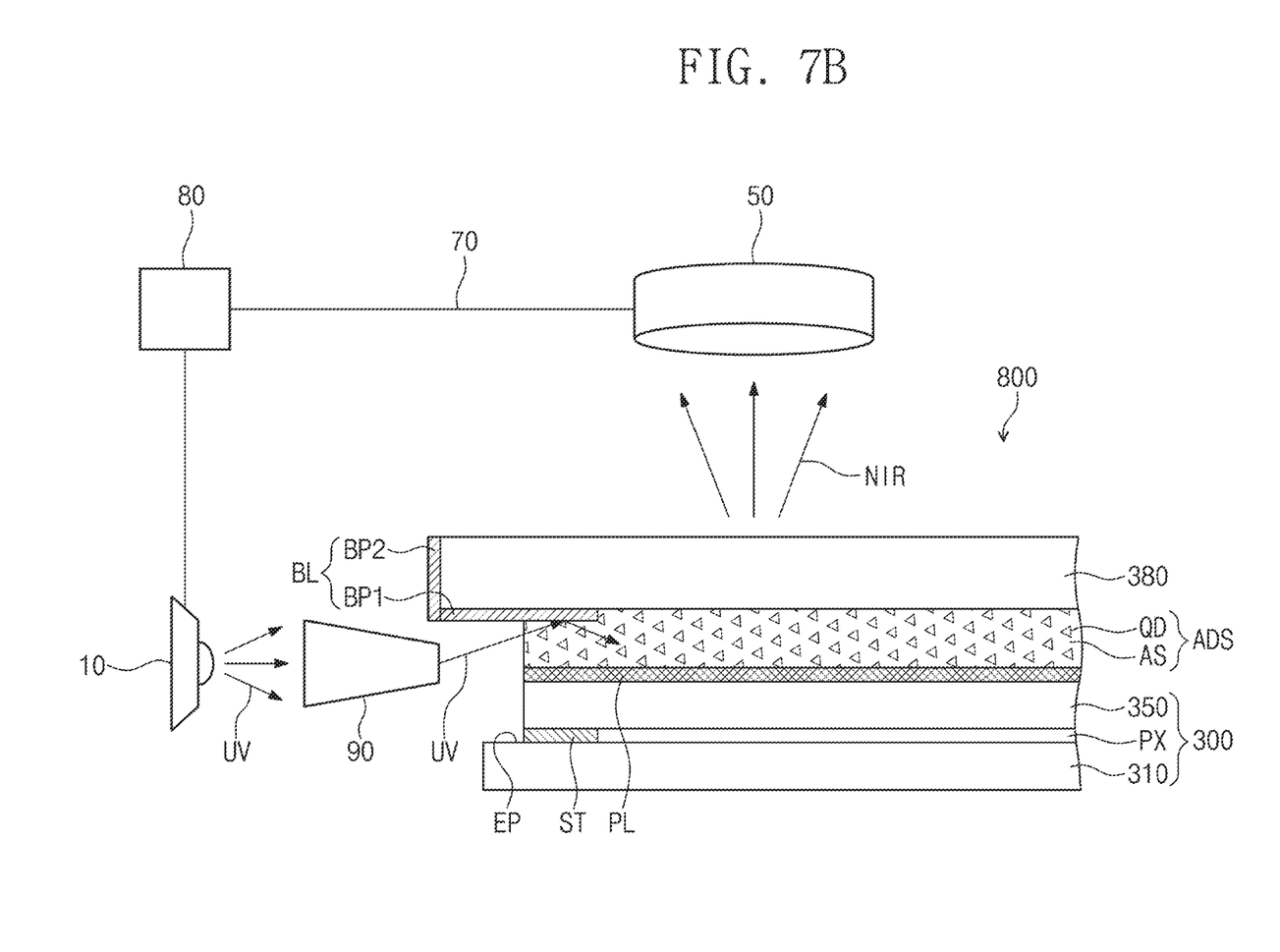

FIG. 7A and FIG. 7B are views showing methods of manufacturing the display device illustrated in FIG. 2. More specifically, FIG. 7A and FIG. 7B are views showing processes of adhering a window of a display device to a display panel. In the description of FIG. 7A and FIG. 7B, the components described above are denoted by the same reference numerals, and redundant description of the components is omitted.

Referring to FIG. 7A, a pre-adhesive member ADS-0 is provided between a display panel 300 and a window 380, and the window 380 is temporarily adhered to the display panel 300 using the pre-adhesive member ADS-0. The pre-adhesive member ADS-0 is a component before the adhesive member ADS is cured, wherein the pre-adhesive member ADS-0 may be a resin having an adhesive property, and the pre-adhesive member ADS-0 may be provided on the window 380 or the display panel 300 using a dispenser.

In this embodiment, the pre-adhesive member ADS-0 may be formed of an adhesive layer AS and a wavelength conversion material QD, and after the wavelength conversion material QD in powder form is provided to an adhesive resin, a material mixed with the adhesive resin and the wavelength conversion material QD may be applied on the window 380 or the display panel 300 to form the pre-adhesive member ADS-0.

After temporarily adhering the window 380 to the display panel 300 using the pre-adhesive member ADS-0, a light source 10 is disposed on one side of the window 380 and the display panel 300, and a light detection unit 50 is disposed over the window 380 and the display panel 300. In this embodiment, the light source 10 may be connected to a control unit 80 by a first signal line 60, and the light detection unit 50 may be connected to the control unit 80 by a second signal line 70.

Thereafter, the light source 10 is driven to irradiate ultraviolet rays UV onto the pre-adhesive member ADS-0, and as a result, the curing of the adhesive layer AS of the pre-adhesive member ADS-0 is started by the ultraviolet rays UV.

In this embodiment, the ultraviolet rays UV emitted from the light source 10 may be guided to the pre-adhesive member ADS-0 side by a light guide unit 90. The width of the light exit portion of the light guide unit 90 is smaller than the width of the light entrance portion of the light guide unit 90, and accordingly, efficiency of the ultraviolet rays UV emitted from the light source 10 through the light guide unit 90 to be incident on the pre-adhesive member ADS-0 may be improved.

Referring to FIG. 7B, the adhesive layer AS is cured by ultraviolet rays emitted from the light source 10, and at the same time, the wavelength conversion material QD absorbs the ultraviolet rays UV and then emits infrared rays NIR. The emitted infrared rays NIR is detected by a light detection unit 50, wherein the light detection unit 50 measures the intensity of the infrared rays NIR or the emission amount of the infrared rays NIR per unit time, and the light detection unit 50 stores the measured intensity of the infrared rays NIR or the measured value of the emission amount.

The measured value stored by the light detection unit 50 is transmitted to a control unit 80 through a second signal line 70. The control unit 80 compares the measured value with a preset value, and the control unit 80 controls the intensity of the ultraviolet rays emitted from the light source 10 on the basis of the measured value.

For example, when the measured value is smaller than the preset value, the control unit 80 determines that the cured degree of the adhesive member ADS is less than a preset level, and as a result, the control unit 80 transmits a control signal to the light source 10 through a first signal line 60. In this case, the intensity of the ultraviolet rays emitted from the light source 10 may be increased by the control signal transmitted to the light source 10. Therefore, the cured degree of the adhesive member ADS may be easily estimated on the basis of the measured value. Thus, the adhesive strength between the window 380 and the display panel 300 using the adhesive member ADS may be maintained to be constant.

While this disclosure has been particularly illustrated and described with reference to example embodiments thereof, it will be understood by those skilled in the art that various changes in form and details may be made therein without departing from the spirit and scope of the disclosure as defined by the appended claims. Therefore, the scope of the disclosure is defined not by the detailed description of the invention but by the appended claims.

What is claimed is:

1. A method for manufacturing a display device comprising:

providing an adhesive member between a display panel and a window, the adhesive member comprising an adhesive layer and a wavelength conversion material dispersed inside the adhesive layer;

disposing a light blocking layer on an entirety of a side surface and a portion of a back surface of the window;

irradiating the adhesive member with light configured to cure the adhesive layer, the wavelength conversion material converts the light into infrared rays;

measuring an intensity and an irradiation amount of the infrared rays emitted from the adhesive member corresponding to the light; and adjusting an intensity or an irradiation amount of the light irradiated to the adhesive member on the basis of the measured intensity and the emission amount of the infrared rays, wherein the light blocking layer has an integrated shape which is extending from the back surface of the window to the side surface of the window.

2. The method of claim 1, wherein the light comprises ultraviolet rays, and the wavelength conversion material comprises a plurality of quantum dots which converts the ultraviolet rays into the infrared rays.

3. The method of claim 1, wherein, when the light is irradiated to the adhesive member, the light is guided to a side of the adhesive member by a light guide unit.

4. The method of claim 1, wherein adjusting the intensity or the irradiation amount of the light irradiated to the adhesive member is accomplished by increasing the intensity or the light amount of the light irradiated to the adhesive member when the measured intensity or the emission amount of the infrared rays is less than a preset value or decreasing the intensity or the light amount of the light irradiated to the adhesive member when the measured intensity or the emission amount of the infrared rays is greater than the preset value.

* * * * *